US012658936B2

(12) United States Patent
Bandyopadhyay et al.

(10) Patent No.: US 12,658,936 B2
(45) Date of Patent: Jun. 16, 2026

(54) SECOND ORDER AUDIO CONTINUOUS TIME DELTA SIGMA MODULATOR WITH RESONATOR

(71) Applicant: SKYWORKS SOLUTIONS, INC., Irvine, CA (US)

(72) Inventors: Abhishek Bandyopadhyay, Winchester, MA (US); Barkat A. Wani, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 119 days.

(21) Appl. No.: 18/436,340

(22) Filed: Feb. 8, 2024

(65) Prior Publication Data

US 2024/0275399 A1    Aug. 15, 2024

Related U.S. Application Data

(60) Provisional application No. 63/484,263, filed on Feb. 10, 2023.

(51) Int. Cl.
  H03M 3/00    (2006.01)
(52) U.S. Cl.
  CPC ........... H03M 3/368 (2013.01); H03M 3/422 (2013.01)
(58) Field of Classification Search
  CPC ............................. H03M 3/368; H03M 3/422
  See application file for complete search history.

(56) References Cited

U.S. PATENT DOCUMENTS

| | | | | |
|---|---|---|---|---|
| 6,396,428 B1 * | 5/2002 | Cheng | ..................... | H03M 3/37 341/143 |
| 6,768,435 B2 * | 7/2004 | Xu | ........................... | H03H 7/01 375/247 |
| 7,110,460 B1 * | 9/2006 | Melanson | ............. | H03M 7/304 375/247 |
| 7,221,302 B1 * | 5/2007 | Melanson | ............. | H03M 3/386 341/131 |
| 7,307,565 B1 * | 12/2007 | Melanson | ........... | H03M 7/3006 341/143 |
| 8,009,077 B1 * | 8/2011 | Melanson | ............. | H03M 3/368 341/143 |
| 8,368,574 B1 * | 2/2013 | Hawk | ................... | H03M 3/368 341/155 |
| 8,531,325 B2 * | 9/2013 | Onody | .................. | H03M 3/392 341/143 |
| 8,874,633 B2 * | 10/2014 | Aravind | ............. | H03H 17/0294 708/300 |

(Continued)

FOREIGN PATENT DOCUMENTS

| | | | | |
|---|---|---|---|---|
| CN | 110739970 A | * | 1/2020 | .......... H03M 1/1245 |
| CN | 120085189 A | * | 6/2025 | |

*Primary Examiner* — Chico A Foxx

(74) *Attorney, Agent, or Firm* — Lando & Anastasi, LLP

(57) ABSTRACT

There is a presented a system for setting a noise transfer function comprising an input configured to receive an analog signal; a quantizer configured to quantize the analog signal to produce a digital signal; a preamplifier configured to adjust at least the amplitude the analog signal; and a resonator configured to adjust at least the amplitude of the analog signal, an output of the resonator being coupled to an output of the preamplifier, the system providing greater attenuation to the analog signal in a frequency band determined by the preamplifier and the resonator.

20 Claims, 6 Drawing Sheets

(56)                    References Cited

U.S. PATENT DOCUMENTS

| | | | | | |
|---|---|---|---|---|---|
| 9,602,126 | B2 * | 3/2017 | Schinkel | ............... | H03M 3/464 |
| 9,729,165 | B2 * | 8/2017 | Gupta | ................... | H03M 3/344 |
| 10,998,917 | B1 * | 5/2021 | Singh | ..................... | H03M 3/49 |
| 2004/0004565 | A1 * | 1/2004 | Melanson | ........... | H03M 7/3006 |
| | | | | | 341/143 |
| 2006/0092059 | A1 * | 5/2006 | Guimaraes | .............. | H03M 3/48 |
| | | | | | 341/143 |
| 2008/0169953 | A1 * | 7/2008 | Yamamoto | ........... | H03M 3/406 |
| | | | | | 341/155 |
| 2009/0066549 | A1 * | 3/2009 | Thomsen | ............. | H03M 3/484 |
| | | | | | 341/143 |
| 2010/0073208 | A1 * | 3/2010 | Karthaus | .............. | H03M 3/382 |
| | | | | | 341/120 |
| 2011/0051954 | A1 * | 3/2011 | Thomsen | ................. | H03F 3/34 |
| | | | | | 381/93 |
| 2011/0175762 | A1 * | 7/2011 | Chae | .................... | H03M 3/446 |
| | | | | | 341/143 |
| 2012/0086589 | A1 * | 4/2012 | Haroun | ................ | H03M 3/344 |
| | | | | | 341/119 |
| 2012/0194365 | A1 * | 8/2012 | Niwa | ................... | H03M 3/424 |
| | | | | | 341/110 |
| 2012/0326904 | A1 * | 12/2012 | Jensen | ................. | H03M 3/396 |
| | | | | | 341/131 |
| 2013/0083868 | A1 * | 4/2013 | Onody | ................. | H03M 3/392 |
| | | | | | 341/143 |
| 2016/0359499 | A1 * | 12/2016 | Bandyopadhyay | ... | H03M 3/458 |
| 2019/0204971 | A1 * | 7/2019 | Kang | ................... | G06F 3/0443 |
| 2019/0348996 | A1 * | 11/2019 | Rajaee | ................. | H03M 3/452 |
| 2021/0112337 | A1 * | 4/2021 | Shajaan | ................... | H04R 3/02 |
| 2023/0065453 | A1 * | 3/2023 | Bandyopadhyay | ... | H03M 3/352 |

* cited by examiner

SECOND ORDER AUDIO CONTINUOUS TIME DELTA SIGMA MODULATOR WITH RESONATOR

CROSS-REFERENCE TO RELATED APPLICATIONS

This application claims priority under 35 U.S.C. § 119(e) to U.S. Provisional Application No. 63/484,263, filed Feb. 10, 2023, titled SECOND ORDER AUDIO CTDSM WITH RESONATOR, which is hereby incorporated by reference in its entirety for all purposes.

BACKGROUND

Delta Sigma Modulators of sufficiently high order can be configured to produce almost any noise transfer function desired, however, these high order circuits can be unstable and impractical.

SUMMARY

According to at least one aspect of the present disclosure there is presented a system for setting a noise transfer function comprising: an input configured to receive an analog signal; a quantizer configured to quantize the analog signal to produce a digital signal; a preamplifier configured to adjust at least the amplitude the analog signal; and a resonator configured to adjust at least the amplitude of the analog signal and/or a noise transfer function (NTF), an output of the resonator being coupled to an output of the preamplifier, the system providing greater attenuation to the analog signal and/or NTF in a frequency band determined by the preamplifier and the resonator.

In some examples, the analog signal includes a noise component based on the quantizer. In various examples, providing greater attenuation to the analog signal includes providing the greater attenuation to the noise component of the analog signal within the frequency band. In many examples, the system further comprises a first summing node coupled to an output of the preamplifier; a second summing node coupled to the quantizer; and a plurality of integrators coupled between the first summing node and the second summing node. In various examples, each output of each integrator of the plurality of integrators is coupled, in a feedforward topology, to the second summing node. In many examples, the system further comprises a plurality of amplifiers, wherein each amplifier of the plurality of amplifiers is coupled between the output of a respective integrator of the plurality of integrators and the second summing node. In some examples, the plurality of integrators are coupled in series between the first summing node and the second summing node, the plurality of integrators coupled in series having a first end nearest the preamplifier and a second end nearest the second summing node. In many examples, the resonator is coupled between an output of an integrator of the plurality of integrators at the second end of the plurality of integrators and an input of an integrator of the plurality of integrators at the first end of the plurality of integrators. In various examples, the system further a first digital-to-analog converter (DAC) and a second DAC coupled to the quantizer, wherein the second DAC is coupled to an input of the preamplifier and the first DAC is coupled to the second summing node.

According to at least one aspect of the present disclosure, there is presented a system for reducing noise in a frequency band comprising: an input configured to receive an analog signal; a first summing node coupled to the input configured to sum an output signal and the analog signal; a preamplifier coupled to the first summing node and configured to adjust at least the amplitude of the analog signal; a quantizer coupled to an output and to the first summing node and configured to produce an output signal based on the analog signal; a feed forward block coupled to the preamplifier and configured to adjust at least an amplitude of the analog signal; a resonator coupled to the feed forward block and to an output of the preamplifier and configured to provide a resonator signal based on the analog signal to the output of the preamplifier.

In various examples, the system further comprises a series of integrators, the series of integrators having a number of integrators coupled in series in a feedforward topology equal to an order of the system. In many examples, the order of the system is two or less. In some examples, the resonator receives a signal based on the analog signal from an integrator in the feed forward block and adjusts the signal to produce the resonator signal. In various examples, the quantizer is further coupled to the feed forward block. In many examples, the system further comprises an amplifier coupled to the input and the first summing node and configured to adjust at least the amplitude of the analog signal.

According to at least one aspect of the present disclosure, there is presented a feedback loop circuit (feedback loop) having a signal transfer function and a noise transfer function comprising: an input configured to receive an input signal; a quantizer configured to produce an output signal; a feedback line coupled between an output of the quantizer and the input, the feedback line configured to combine the output signal with the input signal to produce a summed signal; a preamplifier coupled to the input and configured to receive the summed signal and adjust at least the amplitude of the summed signal; and a resonator coupled to the output of the preamplifier and configured to provide a resonator signal to the output of the preamplifier.

In some examples, the response of the feedback loop to the input signal is based on the signal transfer function and the response of the feedback loop to the output signal is based, at least in part, on the noise transfer function.

According to at least one aspect of the present disclosure, there is presented a feedback loop circuit having a signal transfer function and a noise transfer function comprising: an input configured to receive an input signal; a quantizer configured to provide an output signal; a first summing node coupled between the input and the output and configured to combine the input and output signals to produce a summed signal, the summed signal having a noise component based on noise produced by the quantizer; a preamplifier coupled to the first summing node and configured to adjust at least an amplitude of the summed signal; and a resonator coupled to an output of the preamplifier and configured to provide a resonator signal based at least in part on the summed signal.

In some examples, the signal transfer function is approximately constant and is indicative of a response of the feedback loop circuit to the input signal. In various examples, the noise transfer function depends on a gain adjustment value of the preamplifier and a gain adjustment value of the resonator, the respective gain adjustment values being indicative of an amount of adjustment of the amplitude of at least a signal based on the summed signal.

According to at least one aspect of the present disclosure, there is presented a loop filter for setting a noise transfer function comprising: an input configured to receive an analog signal; a quantizer configured to quantize the analog signal to produce a digital signal; a preamplifier configured to adjust at least the amplitude the analog signal; and a resonator configured to adjust at least the noise transfer function of the loop filter, an output of the resonator being coupled to an output of the preamplifier, the system providing greater attenuation to the noise transfer function in a frequency band determined by the preamplifier and the resonator.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
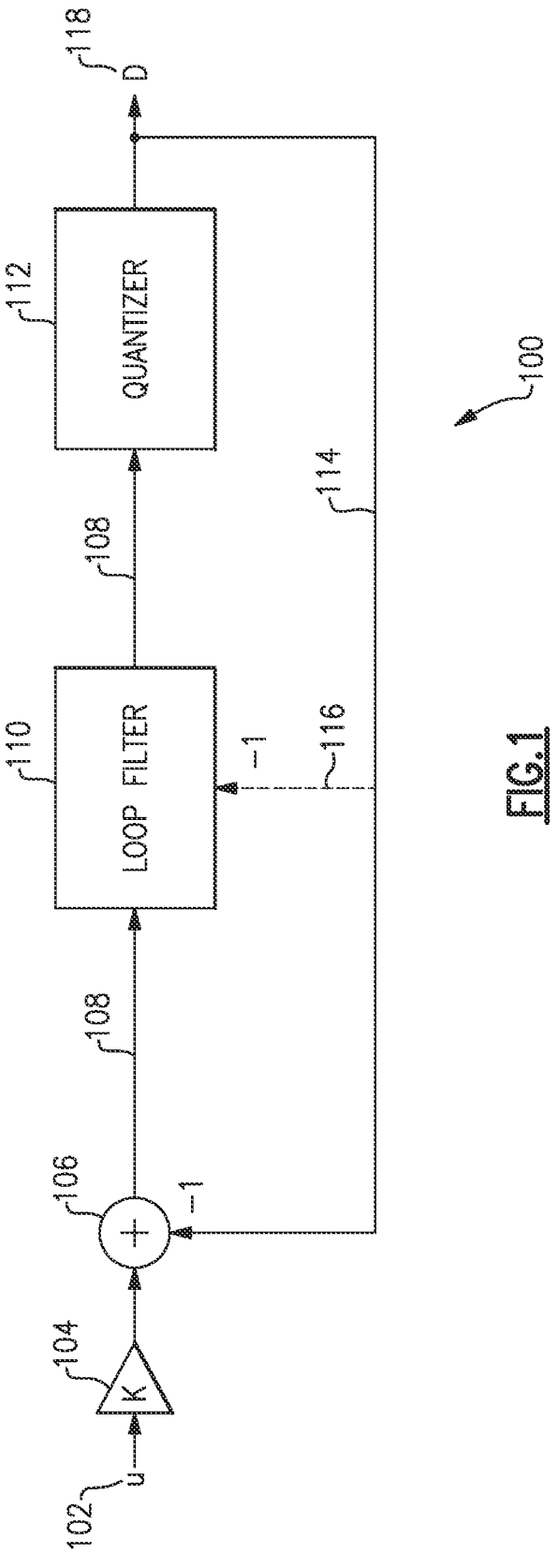
FIG. 1 illustrates a continuous time delta sigma modulator (CTDSM) with a feedback loop according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Microphones may be used to sense audio signals and convert the audio signal to an electrical signal. In many cases, the electrical signal is a "small" signal, meaning it has low amplitude, which can be disadvantageous when attempting to provide a broad dynamic range or a high signal-to-noise ratio (SNR) for the electrical signal. While reference is made to microphones, techniques and methods described herein can be applied to any small electrical signal and to larger electrical signals.

A pre-amplifier may be used to provide gain to the electrical signal to produce a scaled signal based on the electrical signal. The preamplifier then provides the scaled signal to a signal processing circuit, such as a continuous time delta sigma modulator (CTDSM), or other signal processing circuit, that performs operations on the scaled signal. The signal processing circuit may have a signal transfer function (STF) that may allow a desired signal within a certain frequency band to pass through, but may block unwanted signals that lie outside the desired frequency band, and may also include a quantization operation (e.g., to convert the signal to digital form) that has a corresponding signal to quantization noise ratio (SQNR).

The quantization operation may add noise, and that noise may have a corresponding noise transfer function (NTF). In some CTDSMs, a loop filter may proceed a quantizer. The NTF is the closed loop transfer function that the quantization noise sees from the output of the quantizer. It is desirable to shape the NTF to reduce quantization noise. Higher order circuits (3rd order and higher, for example) allow for precise shaping of the NTF but tend to use more energy and/or power than lower order circuits (1st and 2nd order, for example) and to be less stable than the lower order circuits.

Examples and embodiments herein relate to shaping the NTF using a second order filter with high stability and a resonator, thus saving power, boosting stability, and shaping the NTF in a desirable manner.

FIG. 1 illustrates a Continuous Time Delta Sigma Modulator 100 ("CTDSM 100") having a feedback loop according to an example. The CTDSM 100 has an input 102, a preamplifier 104, a summing node 106, a forward line 108, a loop filter 110, a quantizer 112, a feedback line 114, an optional branch line 116 of the feedback line 114, and an output 118.

The CTDSM 100 is configured to amplify an input signal (denoted by "u"), such as the signal provided by a MEMS microphone, quantize the signal (e.g., convert a range of analog values to a single value, as may be done by an analog-to-digital converter or other device), and then output the signal. The output signal (denoted by "D") may then be used for various purposes, such as digital signal processing ("DSP").

The input 102 is coupled to the preamplifier 104. The preamplifier 104 is coupled to the summing node 106. The summing node 106 is coupled to the forward line 108, the loop filter 110 (via the forward line 108), the feedback line 114 (and thus the output 118 and quantizer 112 via the feedback line 114) and, optionally, the optional branch line 116.

The input signal received at the input 102 is initially scaled by a factor of "K" by the preamplifier 104. The factor "K" may be any value, but is generally a non-zero value. In some example, the value of "K" will be equal to or greater than 1. The scaled signal produced by the amplifier 104 is then provided to the summing node 106. The summing node 106 sums together the scaled input signal and the output signal. In some examples, the output signal is inverted and/or subtracted as from the input signal at the summing node 106 (as represented by the "−1" in FIG. 1 near the summing node 106) as part of the summing of the scaled input signal and the output signal. In some examples, a digital-to-analog converter ("DAC") may be included on the feedback line 114 to convert the quantized signal provided by the quantizer 112 from digital to analog form. In some examples, the DAC may be included in the summing node 106. By summing together the input signal and the output signal, a feedback loop is created that can be used to stabilize and/or manipulate the system to produce a desired frequency response.

The summing node 106 provides the summed signal to the loop filter 110. The loop filter 110 includes, for example, integrators, summing nodes, possibly a DAC for the optional branch line 116, and so forth. The loop filter 110 may also include feed forward lines and amplifiers to effectuate a feed forward topology so that the system has a desired frequency response (and thus a desired signal transfer function). The loop filter 110 may be of any order (e.g., 1st order, 2nd order, 3rd order, 17th order, and so forth). The loop filter 110 provides an adjusted version of the summed signal to the quantizer 112, and the quantizer 112 converts the received signal from analog to digital form and provides the resulting digital signal to the output 118 and the feedback line 114, optionally including the optional branch line 116.

Figure 2A:
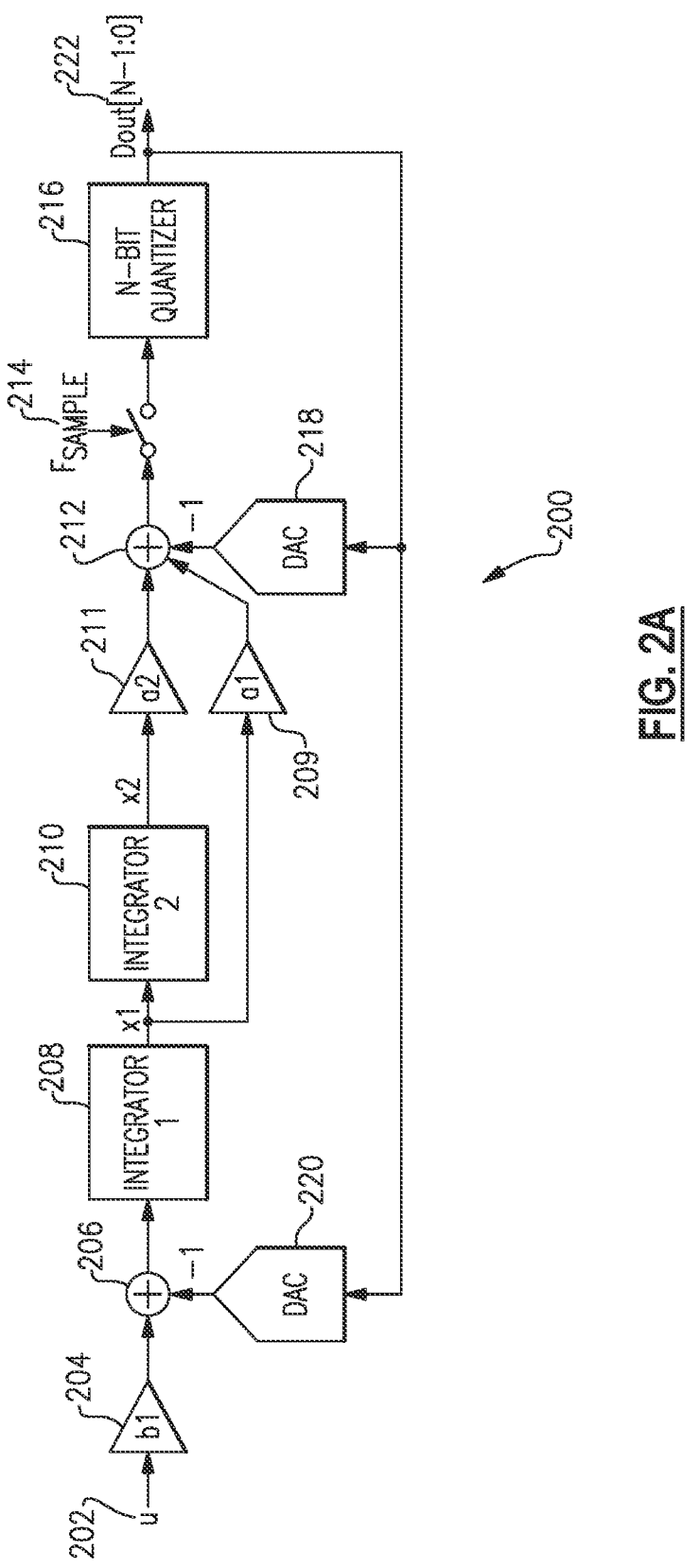
FIG. 2A illustrates a CTDSM according to an example.

FIG. 2A illustrates a CTDSM 200 that is one example of an implementation of the CTDSM 100 described with respect to FIG. 1. The CTDSM 200, as illustrated, is a 2nd order CTDSM, as indicated by the two integrators 208, 210 included therein, and operates as a loop filter for the input signal. The CTDSM 200 includes an input 202 for an input signal ("u"), an input element 204, a first summing node 206, a first integrator 208, a first feedforward element 209, a second integrator 210, a second feedforward element 211, a second summing node 212, a sampling element 214, a quantizer 216, a first DAC 218, a second DAC 220, and an output 222.

The input signal is provided to the input element 204. The input element 204 scales the input signal by given factor ("b1" in this example) and provides the scaled signal to the first summing node 206. The first summing node 206 sums the scaled signal and the output of the DAC 220. In some examples, the first summing node 206 sums the scaled signal and the output by subtracting the output from the scaled signal. The resulting summed signal is provided by the first summing node 206 to the first integrator 208. The first integrator 208 integrates the signal, which, in some examples, is equivalent to providing additional gain to the signal. The first integrator 208 then provides the signal to the second integrator 210 and to the first feedforward element 209. The first feedforward element 209 further adjusts the signal by a factor and provides the signal to the second summing node 212. The second integrator 210 also adjusts the signal—in some examples by providing further gain according to another factor, and then provides the signal to the second feedforward element 211, which adjusts the signal by yet another factor in its turn. The second feedforward element 211 then provides the signal to the second summing node 212. The first and second feedforward elements 209, 211 will, in some examples, apply a gain factor with an absolute value of less than one to the signal.

The second summing node 212 sums the signals received from the two feedforward elements 209, 211 and from the first DAC 218, and provides the resulting summed signal to the quantizer 216 at a sample rate determined by the sampling element 214. As shown in FIG. 2A, the signal from the first DAC 218 may be inverted and/or subtracted from the signals received from the two feedforward elements 209, 211 at the second summing node 212 (as represented by the "−1" in FIG. 2A near the second summing node 212). The sampling element 214 may be a switch, a register, or any other circuit capable of providing samples at a set and/or desired rate to the quantizer 216. The quantizer receives the samples of the summed signal from the second summing node 212 and converts the signal from analog to digital form (or from continuous to discrete form). The quantizer 216 provides the digital signal to the output 222 and to the DACs 218, 220. The first and second DACs 218, 220 convert the digital signal back to analog form so that the summing nodes 206, 212 can sum the signal. In this way, the DACs 218, 220 help to complete the feedback loop for the CTDSM 200.

Figure 2B:
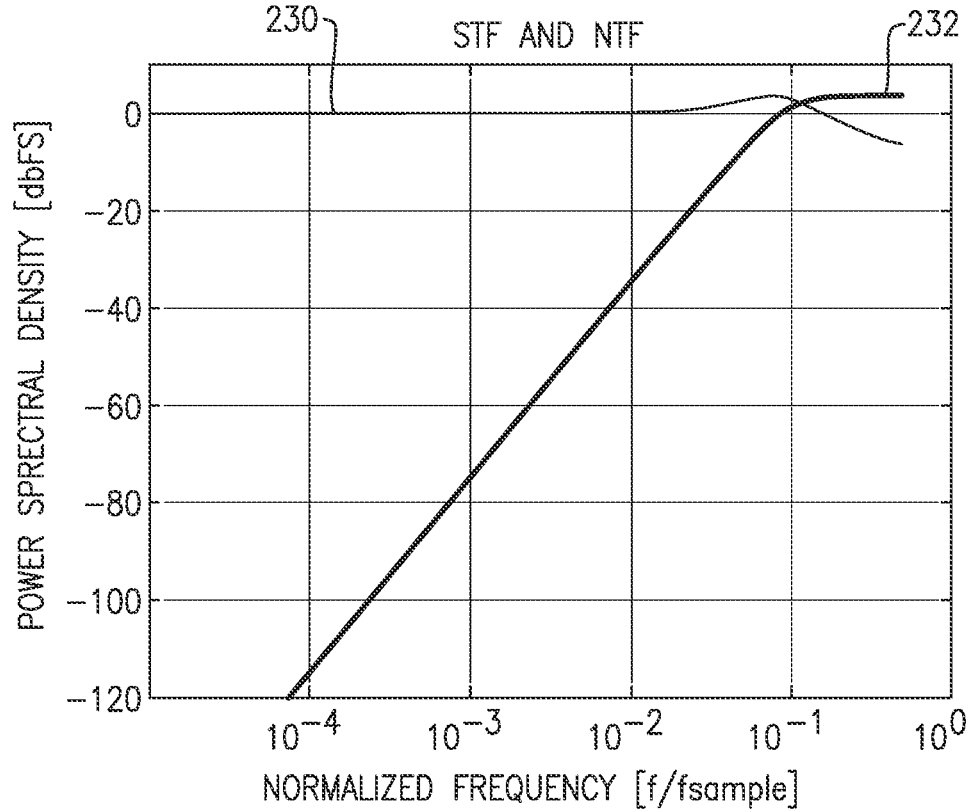
FIG. 2B illustrates a graph of the system transfer function (STF) and noise transfer function (NTF) of the CTDSM of FIG. 2A according to an example.

The CTDSM 200 has specific frequency response characteristics. FIG. 2B includes a first trace 230 showing the STF of the CTDSM 200, and a second trace 232 showing the NTF of the CTDSM 200. The x-axis shows the normalized frequency and the y-axis shows the power spectral density (dBFS).

The quantizer 216 adds noise during operation of the CTDSM 200. The noise generated by the quantizer 216 reacts differently compared to the input signal when processed, for example via the feedback loop, by the CTDSM 200. The second trace 232 shows the noise transfer function of the CTDSM 200 with respect to the noise generated by the quantizer 216. The first trace 230 shows the signal transfer function of the CTDSM 200 with respect to the input signal. The first trace 230 shows that the CTDSM 200 acts like a low pass filter with respect to the input signal. That is, there is little gain or attenuation at a normalized frequency range of less than a threshold normalized frequency. In the example given in FIG. 2B, at a normalized frequency of approximately 10-1 the STF peaks (i.e., gain is at a maximum) and then rapidly falls (and may continue to fall at higher normalized frequencies). Note, these normalized frequency ranges (e.g., 10-1) are merely examples. The precise frequency ranges corresponding to a given level of attenuation or gain depend on the characteristics of at least the feedback loop of the CTDSM 200. In some examples, there is little or no gain and/or attenuation provided at a desired frequency band, such as the audio frequency band, with greater or lesser gain and/or attenuation being provided at other frequency bands.

On the other hand, the second trace 232 shows that the CTDSM 200 acts like a high pass filter with respect to the noise generated by the quantizer 216. In particular, at normalized frequencies less than a threshold normalized frequency, the CTDSM 200 substantially attenuates the noise, but at frequencies greater than the threshold normalized frequencies, the CTDSM 200 performs little attenuation and may even amplify the noise. In this examples, the threshold normalized frequency is approximately 10-1, however this value is arbitrary and depends on the characteristics of the feedback loop of the CTDSM 200. For example, the threshold normalized frequency could be 10-0.5, 10-2, and so forth.

Thus, for normalized frequency ranges below the threshold normalized frequency, the CTDSM 200 may have a high and/or relatively high SNR and SQNR. However, the ratio of the STF to the NTF decreases as the frequency increases, indicating that, in general, as frequency increases the SQNR of the CTDSM 200 decreases.

The interplay between the STF and the NTF can produce undesirable outcomes. For example, the example of the second trace 232 shows that the NTF allows noise to pass at normalized frequencies near and/or above the threshold normalized frequency. In FIG. 2B, the NTF amplifies noise at or above the threshold normalized frequency, and provides relatively little attenuation to normalized frequencies near, but less than the threshold normalized frequency. The noise amplifying characteristics of the CTDSM 200 at normalized frequencies above threshold normalized frequency may not matter in certain applications—for example, in audio applications where the frequencies above the threshold normalized frequency would be inaudible. In other cases, the scaled noise may drown out the input signal in a desired frequency range, for example, where the first trace 230 (the STF) is less than the second trace 232 (the NTF). But even in cases where the NTF is less than the STF, the NTF may not sufficiently attenuate the noise, which could interfere with the input signal (as it responds according to the STF). For example, at a normalized frequency of 10-2, even with the attenuation to the noise as indicated by the NTF, the noise could still interfere with the input signal, for example by raising the noise floor or producing—in an audio context—audible noise (like hissing, popping, scratching, static, and so forth).

Figure 3:
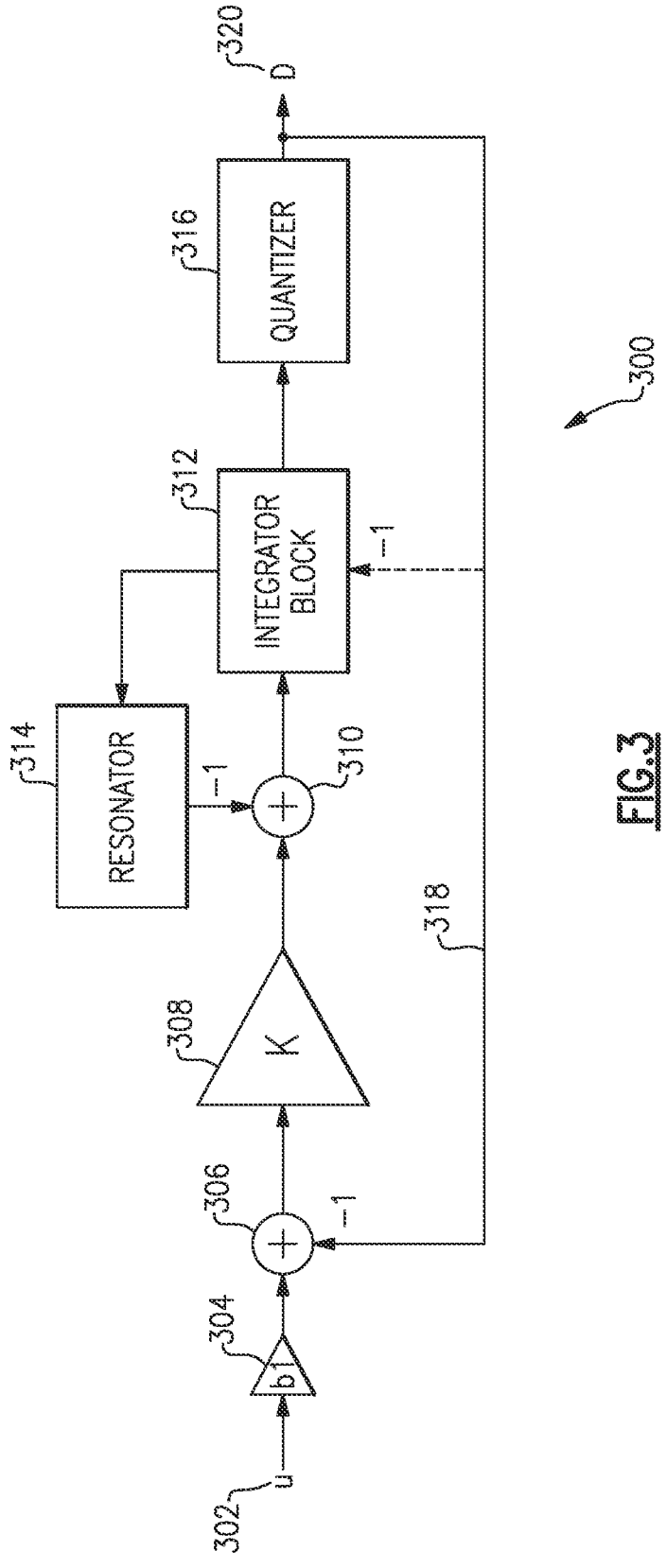
FIG. 3 illustrates a CTDSM according to an example.
Figure 4A:
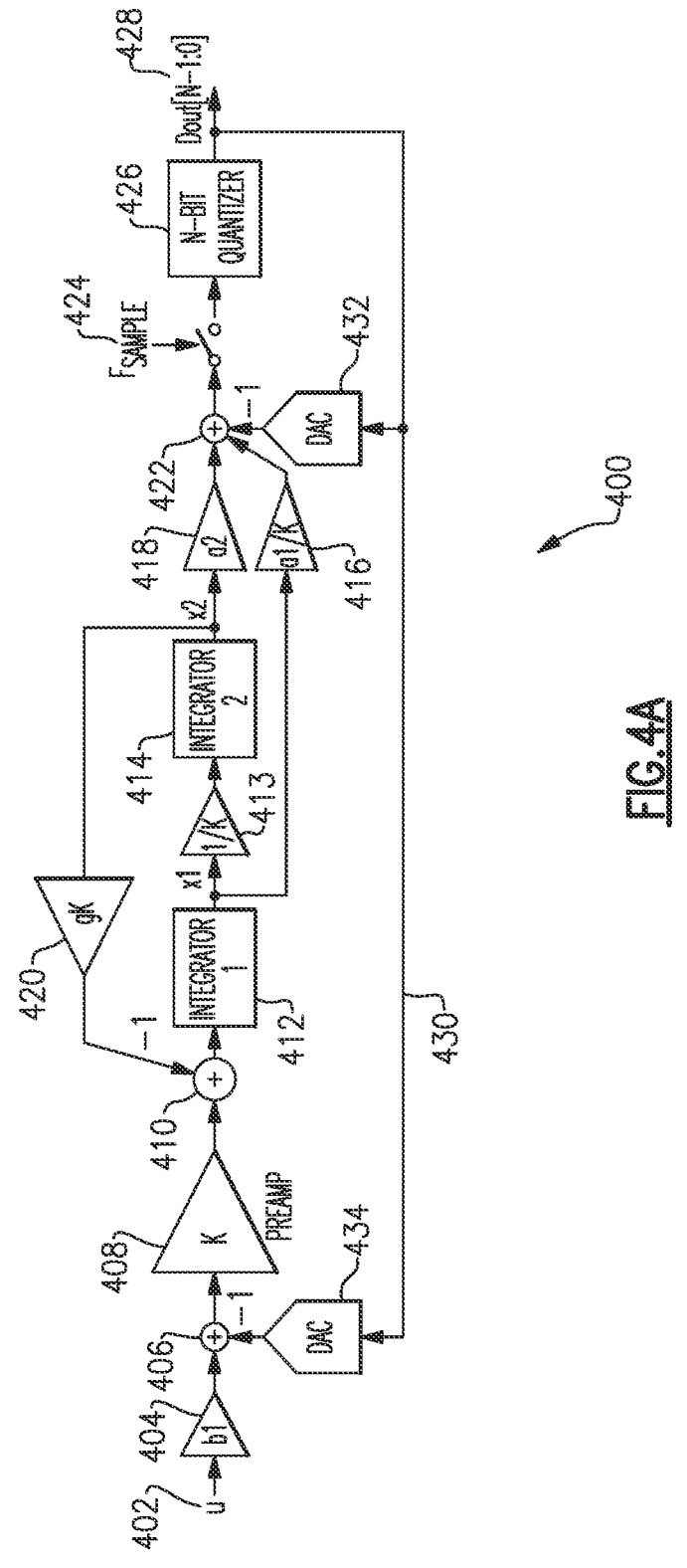
FIG. 4A illustrates a CTDSM according to an example.
Figure 4B:
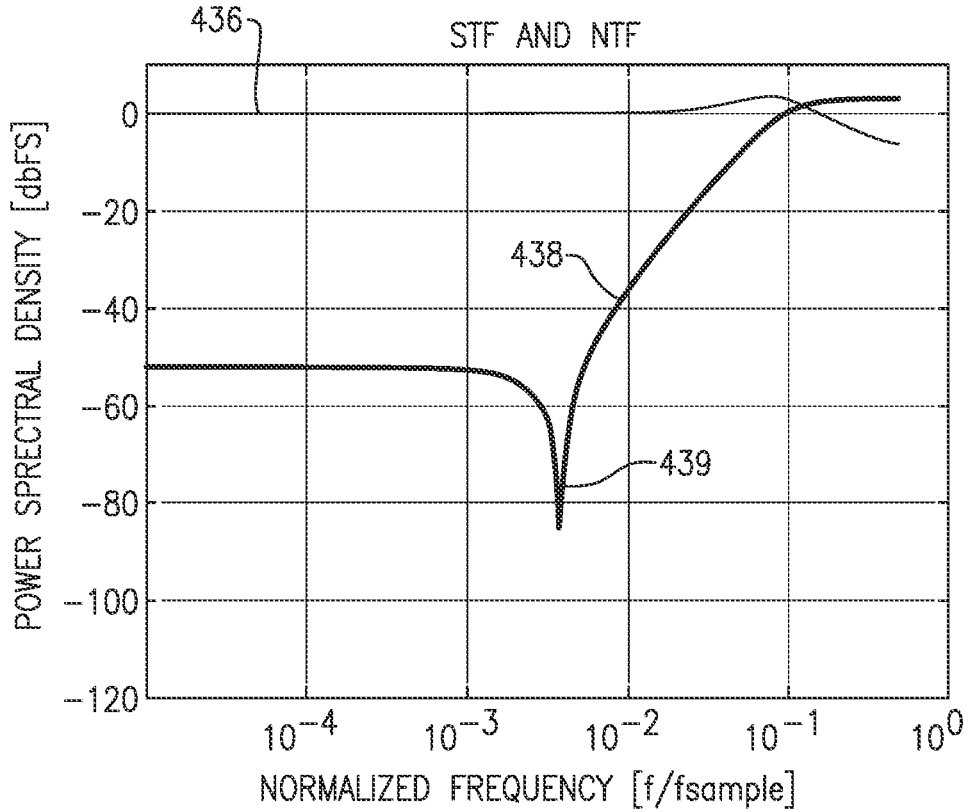
FIG. 4B illustrates a graph of the STF and NTF of the CTDSM of FIG. 3A according to an example.

The following CTDSM topology, of FIGS. 3, 4A, and 4B, provides a mechanism for manipulating the NTF to create a "notch" of greater attenuation for a desired frequency range without necessarily increasing the order of the CTDSM. With respect to the order of the CTDSM, one method of manipulating the NTF (e.g., trace 232 of FIG. 2B) is to increase the order of the CTDSM from a lower order (e.g., 1st order or 2nd order) to a higher order (e.g., 2nd order, 3rd order, 10th order, and so forth). By increasing the order of the CTDSM, the NTF (and the STF) can be made to have an arbitrary curve or shape, though at the expense of stability, power usage, and cost since more parts (e.g., integrators, amplifiers, etc.) are needed the higher the order the CTDSM. The following CTDSM topologies maintain low power use and high stability, and may be less expensive, contrary to traditional, higher order solutions to the problem of reducing SQNR at certain frequencies.

FIG. 3 illustrates a CTDSM 300 according to an example. The CTDSM 300 uses a resonator and an in-loop preamplifier topology to create a "notch" in the NTF of the CTDSM 300 compared to that of the CTDSM 200 or the CTDSM 100, the notch corresponding to a desired frequency range. The notch will be illustrated in greater detail with respect to FIG. 4B.

The CTDSM 300 includes an input 302 coupled to a first input element 304. The first input element 304 is coupled to a first summing node 306. The first summing node 306 is coupled to an in-loop preamplifier 308, as well as to the output 320 and the quantizer 316 via a feedback line 318. The in-loop preamplifier 308 is coupled to the second summing node 310.

The second summing node 310 is coupled to the integrator block 312, which can include a cascade of integrators, and the resonator 314. The integrator block 312 is coupled to the resonator 314 and the quantizer 316 and optionally to the feedback line 318. The quantizer 316 is coupled to the output 320 via the feedback line 318.

The CTDSM receives an input signal ("u") at the input 302. The input signal is passed to a first amplifier 304 which may adjust the amplitude of the input signal by a factor (here, "b1"). The signal is then provided to the first summing node 306, where the signal is summed together with a feedback signal produced by the quantizer 316 and passed along via the feedback line 318. In some examples, summing the signal with the feedback signal includes subtracting the feedback signal from the signal. The resulting summed signal is then input into the preamplifier 308. The preamplifier 308 amplifies the summed signal by a factor (here, "K"), and provides the resulting scaled signal to the second summing node 310. At the second summing node 310, the scaled signal is summed together with the output of the resonator 314, and the resulting signal is provided to the input of the integrator block 312. In some examples, the summing the scaled signal with the output of the resonator 314 includes subtracting the output of the resonator from the scaled signal.

The integrator block 312 may modify the signal it receives from the second summing node 310 in a variety of ways. The integrator block 312 may provide gain or attenuation to the signal, adjust the phase of the signal, split the signal into multiple signals and recombine some or all of said signals, and so forth. In some examples, the integrator block 312 also receives the output signal from the quantizer 316. The integrator block 312 provides a resonator input signal to the resonator 314, and a quantizer input signal to the quantizer 316. Both the resonator input signal and the quantizer input signal can be based, in whole or in part, on the signal received by the integrator block 312 from the second summing node 310. In some examples, the resonator input signal and quantizer input signal are also based, in whole or in part, on the output signal received from the quantizer 316.

The resonator 314 adjusts the resonator input signal. In some examples, the resonator 314 adjusts the gain and/or phase of the resonator input signal by one or more factors. The resulting signal is then provided to the second summing node 310.

The quantizer 316 converts the quantizer input signal from analog to digital form. The quantizer 316 may be, for example, an ADC of some type, or any other type of circuit that converts analog signals to digital or discrete forms.

The CTDSM 300 topology described here, through the use of the resonator 314 and the in-loop preamplifier 308, can create a notch in the NTF of the CTDSM 300. As a result, the response of the CTDSM to noise generated by the quantizer (e.g., quantizer 316) may be attenuated by a large amount within a given range or centered around a given frequency, as will be discussed more with respect to FIG. 4B.

Turning now to FIG. 4A, a CTDSM 400 with a resonator is presented according to an example. The CTDSM 400, like the CTDSM 300, may have a notch in its corresponding NTF, as will be discussed in greater detail with respect to FIG. 4B. The CTDSM 400 is one example of an implementation of the CTDSM 300.

The CTDSM 400 has an input 402 configured to receive an input signal ("u"), a first input element 404, a first summing node 406, an in-loop preamplifier 408, a second summing node 410, a first integrator 412, a scaling element 413, a second integrator 414, a first feedforward element 416, a second feedforward element 418, a resonator 420, a third summing node 422, a sampling element 424, a quantizer 426, an output 428, a feedback line 430, a first DAC 432, and a second DAC 434.

The input 402 is coupled to the first input element 404. The first input element 404 is coupled to the first summing node 406. The first summing node 406 is coupled to the in-loop preamplifier 408 and the second DAC 434. The preamplifier is coupled to the second summing node 410. The second summing node is coupled to the resonator 420 and the first integrator 412. The first integrator 412 is coupled to scaling element 413 and the first feedforward element 416. The scaling element 413 is coupled to the second integrator 414. The second integrator 414 is coupled to the resonator 420 and the second feedforward element 418. The third summing node 422 is coupled to the second DAC 432, the sampling element 424, the first feedforward element 416, and the second feedforward element 418. The quantizer 426 is coupled to the sampling element 424, the output 428, the feedback line 430 (and, via the feedback line 430) both the first DAC 432 and second DAC 434.

The input signal is received at the input 402 and provided to the first input element 404. The first input element 404 adjusts the amplitude of the input signal by a factor (here, "b1"). The signal is then provided by the first input element 404 to the first summing node 406. At the first summing node, the signal is summed with the output of the second DAC 434 and the resulting signal is provided to the in-loop preamplifier 408. In some examples, as indicated by the "−1" in FIG. 4, the summing of the signal and the output includes subtracting the output from the input. The in-loop preamplifier 408 adjusts the amplitude of the signal by a factor (here, "K"), and provides the resulting signal to the second summing node 410. At the second summing node 410, the signal is summed together with the output of the resonator 420, and the resulting signal is provided to the first integrator 412. In some examples, as indicated by the "−1" in FIG. 4, summing the signal with the output includes subtracting the output from the signal.

The first integrator 412 adjusts the amplitude and/or phase of the signal by a factor. In this example, the integrator factor is determined by frequency, and may be inversely proportional to frequency, such that at low frequencies the integrator provides high gain and at high frequencies the integrator provides lower gain or provides attenuation near the sampling frequency. The amount of attenuation provided at high frequencies depends on stability constraints. The phase of the signal may also be adjusted. The resulting signal is provided to second integrator 414 via the scaling element 413. The scaling element 413 scales the signal in a manner proportional to the adjustment provided by the in-loop preamplifier 408 and provides the scaled signal to the second integrator 414. In this example, the scaling factor is "1/K." The first integrator 412 also provides the resulting signal to the first feedforward element 416. The first feedforward element 416 adjusts the signal by a factor proportional to the factor of the in-loop preamplifier 408. In this example, the factor is "a1/K". The first feedforward element 416 provides the resulting signal to the third summing node 422.

The second integrator 414 also adjusts the phase and/or amplitude of the signal. In this example, the second integrator 414 adjusts the amplitude of the signal by a factor related to the frequency of the signal, as with the first integrator 412. The second integrator 414 may adjust the phase of the signal. The second integrator 414 provides the resulting signal to the second feedforward element 418 and the resonator 420.

The second feedforward element 418 adjusts the amplitude of the signal by a factor (here, "a2"). In some examples, the factor may be proportional or inversely proportional to the factor of the preamplifier. The resulting signal is then provided to the third summing node 422.

In some examples, the integrator block 312 of FIG. 3 may include elements such as the first and second integrators 412, 414, the second and third feedforward elements 416, 418, and/or the third summing node 422.

The resonator 420 adjusts the signal it receives from the second integrator 414 by a factor inversely proportional to the factor by which the preamplifier adjusted the signal. Here, the factor is "g·K". The resonator 420 may be implemented in many ways. In some examples, the resonator 420 may be an amplifier, a resistor or a network of resistors that may provide current to the virtual ground of the first integrator 412 and/or in-loop preamplifier 408, or a switched capacitor circuit that may provide current to the virtual ground of the first integrator 412 and/or in-loop preamplifier 408. The resonator 420 provides the resulting signal to the second summing node 410.

The third summing node 422 sums the outputs of the second and third amplifiers 416, 418 and the first DAC 432. In some examples, summing the outputs includes subtracting at least the output of the DAC 432 from the sum of the other outputs. The resulting signal is then sampled by the sampling element 424 to provide samples to the quantizer 426. The quantizer 426 converts the samples of the signal from analog form to digital form to produce a digital version of the signal. The quantizer 426 provides the digital signal as an output signal to the output 428 and the feedback line 430.

The output signal D at the output 428 may be provided to the first and second DACs 432, 434 via the feedback line 430. The DACs 434, 434 convert the output signal from digital form back to analog form, and provide the resulting analog signals to summing nodes. In this example, the first DAC 432 provides the resulting analog signal to the third summing node 422, and the second DAC 434 provides the resulting analog signal to the first summing node 406.

FIG. 4B illustrates the response of the CTDSM 400 according to an example. FIG. 4B includes a first trace 436 showing the STF of the CTDSM 400, and a second trace 438 showing the NTF of the CTDSM 400. The second trace 438 includes a notch 439. The x-axis shows the normalized frequency and the y-axis shows the power spectral density (dBFS). As with FIG. 2B the NTF applies primarily to noise generated by the quantizer 426.

The STF, as shown by the first trace 436, is identical or approximately identical to the STF of FIG. 2B. Thus, the CTDSM 400 performs similar to the CTDSM 200 with respect to the input signal and the response to the input signal.

However, the NTF, as shown by the second trace 438, is considerably different compared to the NTF of FIG. 2B. The amount of attenuation provided by the CTDSM 400 to noise at normalized frequencies below the frequency band centered around the notch 439 is generally less than the attenuation provided to the same normalized frequencies by the CTDSM 200. However, in the frequency band of the notch 439 (roughly between 10-3 and 10-2 in this example), the attenuation provided by the CTDSM 400 to noise is greater than the attenuation of the CTDSM 200 in the same frequency range.

The location of the notch 439 is not set, but can be changed by adjusting the factors of the resonator, various amplifiers, and integrators of the CTDSM 400. By adjusting the factors, a user may move the notch to a desired frequency range. For example, in an audio application, where only the band of frequencies audible to the human car need to be taken into consideration, a user may shift the notch 439 to overlay the frequencies audible to the human car. Thus, compared to the CTDSM 200, the CTDSM 400 allows a user to eliminate or substantially attenuate noise in the audible band of frequencies, resulting in a cleaner output signal. For example, while a user using the CTDSM 200 may hear hissing or popping or other noise, the same noise would be less audible or fully eliminated for a user using the CTDSM 400.

In some examples, the noise attenuated in the notch 439 is shifted to a higher frequency and then filtered out using a low pass filter. For example, in an audio application, the CTDSM 400 can shift noise corresponding to the notch 349 to a higher-than-audible frequency, and a low pass filter could be used to filter out that noise.

In the foregoing examples, the factors (e.g., b1, K, a2, g·K, a1/K, and so forth) may be any value, with g·K and a1/K representing values inversely proportional to K. In the foregoing examples, the term proportional includes the meaning of inversely proportional, and should be taken to mean scaled by a factor. Thus, when the scaling element 413 scales proportionally to the factor K, this can be equivalent to multiplying or dividing the signal by a value based on K.

Various controllers may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include one or more controllers and/or processors configured to execute instructions to perform methods, processes, and/or operations discussed above.

In some examples, the factors discussed herein are programmable using the controller, allowing for a user to dynamically adjust the location of a notch of the noise transfer function.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system for setting a noise transfer function comprising:
   an input configured to receive an analog signal;
   a quantizer configured to quantize the analog signal to produce a digital signal;
   a preamplifier configured to adjust at least the amplitude the analog signal; and
   a resonator configured to adjust at least the amplitude of the analog signal, an output of the resonator being coupled to an output of the preamplifier, the system providing greater attenuation to the analog signal in a frequency band determined by the preamplifier and the resonator.

2. The system of claim 1 wherein the analog signal includes a noise component based on the quantizer.

3. The system of claim 2 wherein providing greater attenuation to the analog signal includes providing the greater attenuation to the noise component of the analog signal within the frequency band.

4. The system of claim 1 further comprising:
   a first summing node coupled to an output of the preamplifier;
   a second summing node coupled to the quantizer; and
   a plurality of integrators coupled between the first summing node and the second summing node.

5. The system of claim 4 wherein each output of each integrator of the plurality of integrators is coupled, in a feedforward topology, to the second summing node.

6. The system of claim 5 further comprising a plurality of amplifiers, wherein each amplifier of the plurality of amplifiers is coupled between the output of a respective integrator of the plurality of integrators and the second summing node.

7. The system of claim 4 wherein the plurality of integrators are coupled in series between the first summing node and the second summing node, the plurality of integrators coupled in series having a first end nearest the preamplifier and a second end nearest the second summing node.

8. The system of claim 7 wherein the resonator is coupled between an output of an integrator of the plurality of integrators at the second end of the plurality of integrators and an input of an integrator of the plurality of integrators at the first end of the plurality of integrators.

9. The system of claim 1 further comprising a first digital-to-analog converter (DAC) and a second DAC coupled to the quantizer, wherein the second DAC is coupled to an input of the preamplifier and the first DAC is coupled to the second summing node.

10. A system for reducing noise in a frequency band comprising:
    an input configured to receive an analog signal;
    a first summing node coupled to the input configured to sum an output signal and the analog signal;
    a preamplifier coupled to the first summing node and configured to adjust at least the amplitude of the analog signal;
    a quantizer coupled to an output and to the first summing node and configured to produce an output signal based on the analog signal;
    a feed forward block coupled to the preamplifier and configured to adjust at least an amplitude of the analog signal;
    a resonator coupled to the feed forward block and to an output of the preamplifier and configured to provide a resonator signal based on the analog signal to the output of the preamplifier.

11. The system of claim 10 wherein the feed forward block further comprises a series of integrators, the series of integrators having a number of integrators coupled in series in a feedforward topology equal to an order of the system.

12. The system of claim 11 wherein the order of the system is two or less.

13. The system of claim 11 wherein the resonator receives a signal based on the analog signal from an integrator in the feed forward block and adjusts the signal to produce the resonator signal.

14. The system of claim 10 wherein the quantizer is further coupled to the feed forward block.

15. The system of claim 10 further comprising an amplifier coupled to the input and the first summing node and configured to adjust at least the amplitude of the analog signal.

16. A feedback loop circuit having a signal transfer function and a noise transfer function comprising:

an input configured to receive an input signal;

a quantizer configured to produce an output signal;

a feedback line coupled between an output of the quantizer and the input, the feedback line configured to combine the output signal with the input signal to produce a summed signal;

a preamplifier coupled to the input and configured to receive the summed signal and adjust at least the amplitude of the summed signal; and a resonator coupled to the output of the preamplifier and configured to provide a resonator signal to the output of the preamplifier.

17. The feedback loop circuit of claim 16 wherein the response of the feedback loop to the input signal is based on the signal transfer function and the response of the feedback loop to the output signal is based, at least in part, on the noise transfer function.

18. The feedback loop circuit of claim 16 further comprising:

a first summing node coupled between the input and an output and configured to combine the input and output signals to produce a summed signal, the summed signal having a noise component based on noise produced by the quantizer.

19. The feedback loop circuit of claim 16 wherein the signal transfer function is approximately constant and is indicative of a response of the feedback loop circuit to the input signal.

20. The feedback loop circuit of claim 16 wherein the noise transfer function depends on a gain adjustment value of the preamplifier and a gain adjustment value of the resonator, the respective gain adjustment values being indicative of an amount of adjustment of the amplitude of at least a signal based on the summed signal.

* * * * *